United States Patent [19]

Bailey et al.

[11] Patent Number: 5,363,100
[45] Date of Patent: Nov. 8, 1994

[54] DIGITAL PEAK-THRESHOLD TRACKING METHOD AND APPARATUS

[75] Inventors: James A. Bailey; Yogesh B. Patel, both of Tucson, Ariz.

[73] Assignee: International Business Machines Corporation, Armonk, N.Y.

[21] Appl. No.: 87,035

[22] Filed: Jun. 30, 1993

[51] Int. Cl.⁵ .................. H03M 1/00; H03M 1/06
[52] U.S. Cl. .................... 341/132; 341/118
[58] Field of Search ............ 341/132, 126, 143, 156, 341/158, 159, 121, 118, 155

[56] References Cited

U.S. PATENT DOCUMENTS

| | | | |
|---|---|---|---|
| 3,553,595 | 1/1971 | Walsh | 341/132 X |
| 4,827,191 | 5/1989 | Chapman | 341/132 |
| 5,027,117 | 6/1991 | Yoshida et al. | 341/132 |
| 5,159,340 | 10/1992 | Smith | 341/132 |

*Primary Examiner*—Sharon D. Logan
*Attorney, Agent, or Firm*—Baker, Maxham, Jester & Meador

[57] ABSTRACT

A peak-detection threshold circuit for digitally adjusting an analog peak-threshold level in a magnetic storage read channel. A digital scheme is used to monitor both the positive (PX) and negative (NX) peaks detected in an analog signal. For both positive and negative thresholds $T_P$ and $T_N$, intermediate peak thresholds $T_M$ are established at selectably lower levels than the peak-detection threshold $T_P/T_N$. Analog signal peaks are detected when the analog signal crosses the intermediate peak threshold $T_M$. The corresponding peak-detection threshold $T_P/T_N$ is then compared to the analog peak amplitude. If the intermediate peak threshold $T_M$ and the corresponding peak threshold $T_P/T_N$ are both exceeded by the analog signal, a digital "increment" error flag bit is generated. If only the intermediate peak threshold $T_M$ is exceeded by the analog signal, a digital "decrement" error flag bit is generated. No error is generated unless the signal exceeds the intermediate peak threshold $T_M$. The increment and decrement error flags are stored sequentially in an error flag history register, which is evaluated to select a digital "added value" for the corresponding stored digital peak threshold $V_P/V_N$. The "added values" are continuously created (one per peak) to create a continuously updated digital value $V_P/V_N$ for each peak-detection threshold. The analog peak-detection threshold level $T_P/T_N$ is generated merely by converting the corresponding stored digital value $V_P/V_N$ to an analog current. Several prioritized mask registers permit selection from among various "added value" magnitudes for variable-speed threshold movement responsive to the variation of analog signal peak levels.

14 Claims, 5 Drawing Sheets

DIGITAL PEAK-THRESHOLD TRACKING METHOD AND APPARATUS

BACKGROUND OF THE INVENTION

1. Field of the Invention

This invention relates generally to signal peak detection in data signal channels and, more specifically, to a digital peak-tracking circuit for a magnetic data storage read channel.

2. Discussion of the Related Art

In a magnetic data storage apparatus, the read channel converts the voltage waveform of a magnetic head output signal to a square waveform representing the original data signal. The head output signal is amplified, equalized and peak-detected to produce a digital signal for processing through a data separator. Because the head output signal contains both data and clock information, shifts of the signal peaks from their nominal timing position directly hinders the data separation procedure and increases the data error rate. The equalizer is a critical element for minimizing the effects of signal peak shifts in the read channel.

Equalization involves the addition of linear filters to modify the channel transfer function so as to provide more reliable data detection by compensating for some of the channel shortcomings. Most of the linear inter-symbol interference in a computer tape recording system arises from the limited bandwidth of the analog channel and the roll-off of signal amplitude with increasing storage density. The equalization is designed to provide the best possible signal to the data separator. The read channel output signal depends on both the head output signal into the channel and the channel transfer function, which includes the analog channel plus all equalizing filters. The ideal equalizer produces pulses with well-defined peaks at times equivalent to the flux-reversal times in the recording medium.

One of the problems associated with optimal channel equalization is the problem of tracking an analog input signal amplitude so that the signal peaks can be detected independent of fluctuations in magnitude. This problem is normally solved by using analog circuitry designed to balance two conflicting requirements. The first requirement is to minimize signal ripple during normal operation and the second requirement is to increase tracking response time so that the peak amplitude tracking circuit can follow a quick signal drop. The usual capacitor-based analog circuitry known in the art must compromise ripple and response time and the resulting performance causes the peak tracking threshold output to droop between signal peaks, effectively increasing ripple.

There is a clearly-felt need in the art for a peak-threshold tracking circuit that is sensitive enough to track rapid fluctuations in the input signal without increasing signal ripple. That is, there is a need for a method that rapidly adjusts a peak-detection threshold level while also avoiding any "droop" in the threshold level between peaks in the signal. The related unresolved problems and deficiencies are clearly-felt in the art and are solved by this invention in the manner described below.

SUMMARY OF THE INVENTION

This invention solves the above-described problem by using a digital scheme rather than the traditional analog approach for updating a peak-tracking threshold level responsive to incoming signal amplitude fluctuations. In the apparatus of this invention, an analog peak-detection threshold level $T_P$ is updated within four system clock cycles to reflect changes in the incoming signal amplitude. The threshold level $T_P$ is adjusted as closely as possible to the "peak grazing" level of the incoming analog signal, thereby ensuring precise detection of signal peak timing.

It is an object of this invention to provide a digitally-updated peak detection threshold signal level $T_P$ for use in analog signal peak detection. It is an advantage of the method and apparatus of this invention that a peak-detection threshold value $V_P$ is stored and updated in digital form, thereby completely eliminating interpeak threshold droop and ripple.

It is another object of this invention to provide rapid correction of the analog peak-detection threshold signal level $T_P$. It is an advantage of the method and apparatus of this invention that the threshold error correction rate is digitally selected responsive to the recent threshold error history.

It is yet another advantage and feature of the method and apparatus of this invention that two independent threshold logic circuits are simultaneously implemented for the positive ($S^+$) and negative ($S^-$) sides of a differential signal, thereby providing independent positive peak-detection threshold ($T_P$) and negative peak-detection threshold ($T_N$) tracking within the same differential signal.

The foregoing, together with other objects, features and advantages of this invention, will become more apparent when referring to the following specification, claims and the accompanying drawing.

BRIEF DESCRIPTION OF THE DRAWING

For a more complete understanding of this invention, reference is now made to the following detailed description of the embodiments as illustrated in the accompanying drawing, wherein.

DESCRIPTION OF THE PREFERRED EMBODIMENTS

Figure 1:
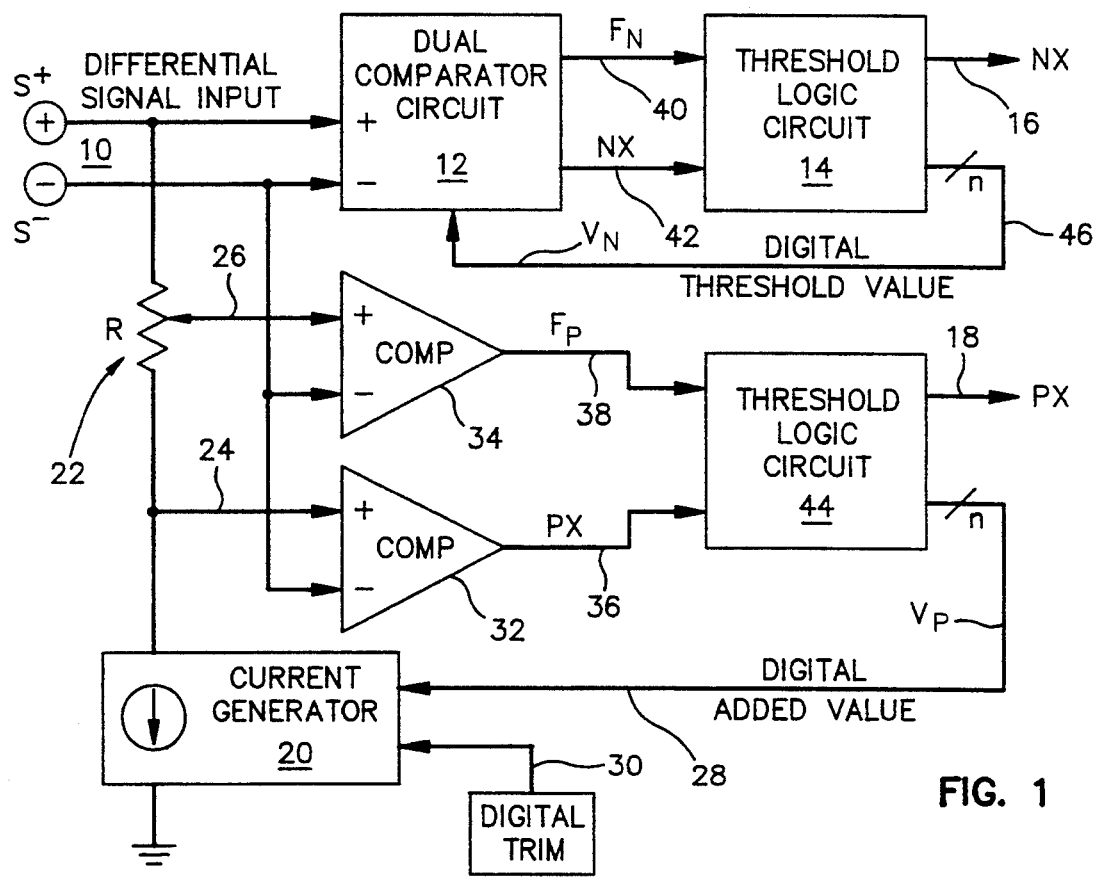
FIG. 1 shows a high-level functional block diagram of the preferred embodiment of the apparatus of this invention.
Figure 2:
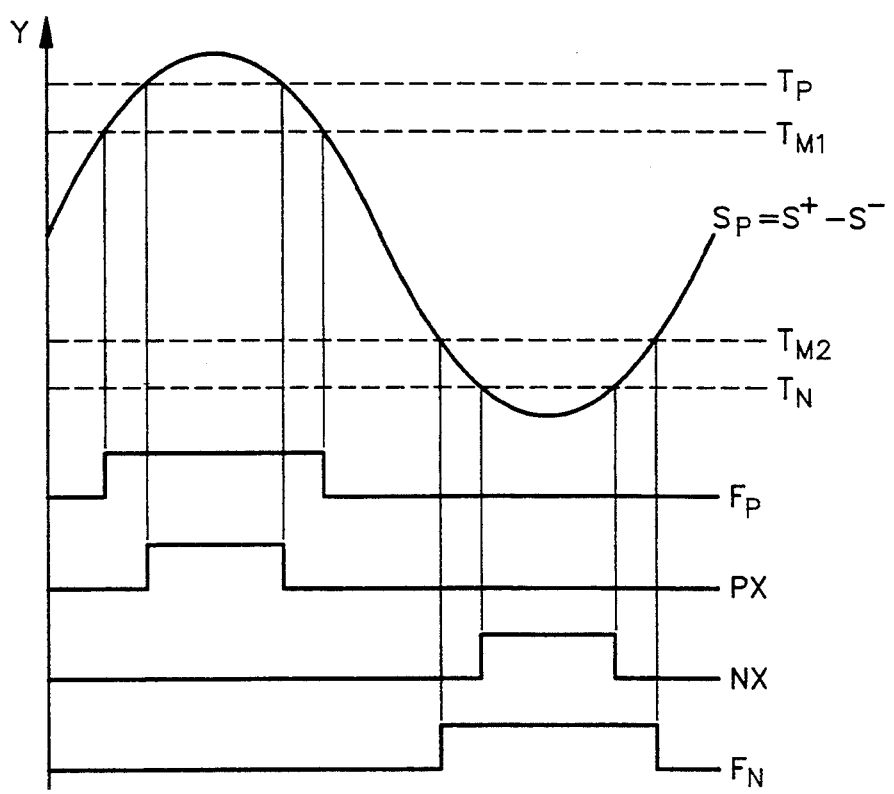
FIG. 2 illustrates the four threshold level signals of the method of this invention.

FIG. 1 shows the preferred embodiment of the digital peak-threshold tracking circuit of this invention. The analog differential signal S at input 10 is obtained from the output of a read channel equalizer (not shown). This input signal 10 is schematically illustrated in FIG. 2 as signal $S_P$. For the purposes of the following discussion, the positive differential signal $(S^+ - S^-)$ is denominated $S_P$ and the inverted differential signal $(S^- - S^+)$ is denominated $S_N$. Negative signal $S_N$ is coupled to the dual-comparator circuit 12 and the threshold logic circuit 14 to obtain the output peak detections NX on line 16. This extraction of NX for $S_N$ is substantially identical to the following discussion of the extraction of PX detections on line 18 for signal $S_P$, as may be appreciated upon examination of FIG. 8.

Referring to FIGS. 1 and 2, two threshold signals, $T_P$ and $T_{M1}$ are created by a current generator 20 and a voltage-divider resistor 22 on lines 24 and 26, respectively. The level of the analog peak-threshold level $T_P$ is controlled by the digital threshold value $V_P$ on the n-bit bus 28. Current generator 20 creates an analog current equivalent to threshold level $T_P$ in response to both digital threshold value $V_P$ on bus 28 and a digital trimming signal on a bus 30. The intermediate threshold level $T_{M1}$ on line 26 is determined by both the voltage-divider resistor 22 and the peak-threshold signal level $T_P$ on line 24. Voltage-divider resistor 22 is adjustable to permit selection of an intermediate threshold level $T_{M1}$ between 25% and 75% of the peak-threshold signal level $T_P$.

The two thresholds signals on line 24 and 26 are connected to the non-inverting inputs of two comparators 32 and 34, respectively. The combination of resistor 22, current generator 20 and comparators 32 and 34 make up a second dual-comparator circuit that is substantially identical in function to dual comparator circuit 12. The negative side $(S^-)$ of input signal $S_P$ is connected to the inverting inputs of comparators 32 and 34. Thus, the output PX of comparator 32 on line 36 rises from "0" to "1" when signal $S_P$ rises above the analog peak-threshold level $T_P$, as shown in FIG. 2. Similarly, the positive peak-detection flag $F_P$ output on line 38 from comparator 34 rises from "0" to "1" when signal $S_P$ rises above the intermediate threshold level $T_{M1}$. FIG. 2 also shows the relationship of a second negative-peak-detection flag $F_N$ on line 40 and the negative peak detections NX on line 42 to the second intermediate threshold level $T_{M2}$ and the second negative peak-threshold level $T_N$. The peak detection flag $F_P$ on line 38 and the PX signals on line 36 are coupled to a second threshold logic circuit 44, which is substantially identical in function to threshold logic circuit 14 except that the digital positive threshold value $V_P$ on n-bit bus 28 represents the positive analog peak-threshold level $T_P$ and the digital negative threshold value $V_N$ on n-bit bus 46 represents the negative analog peak-threshold level $T_N$.

Figure 3:
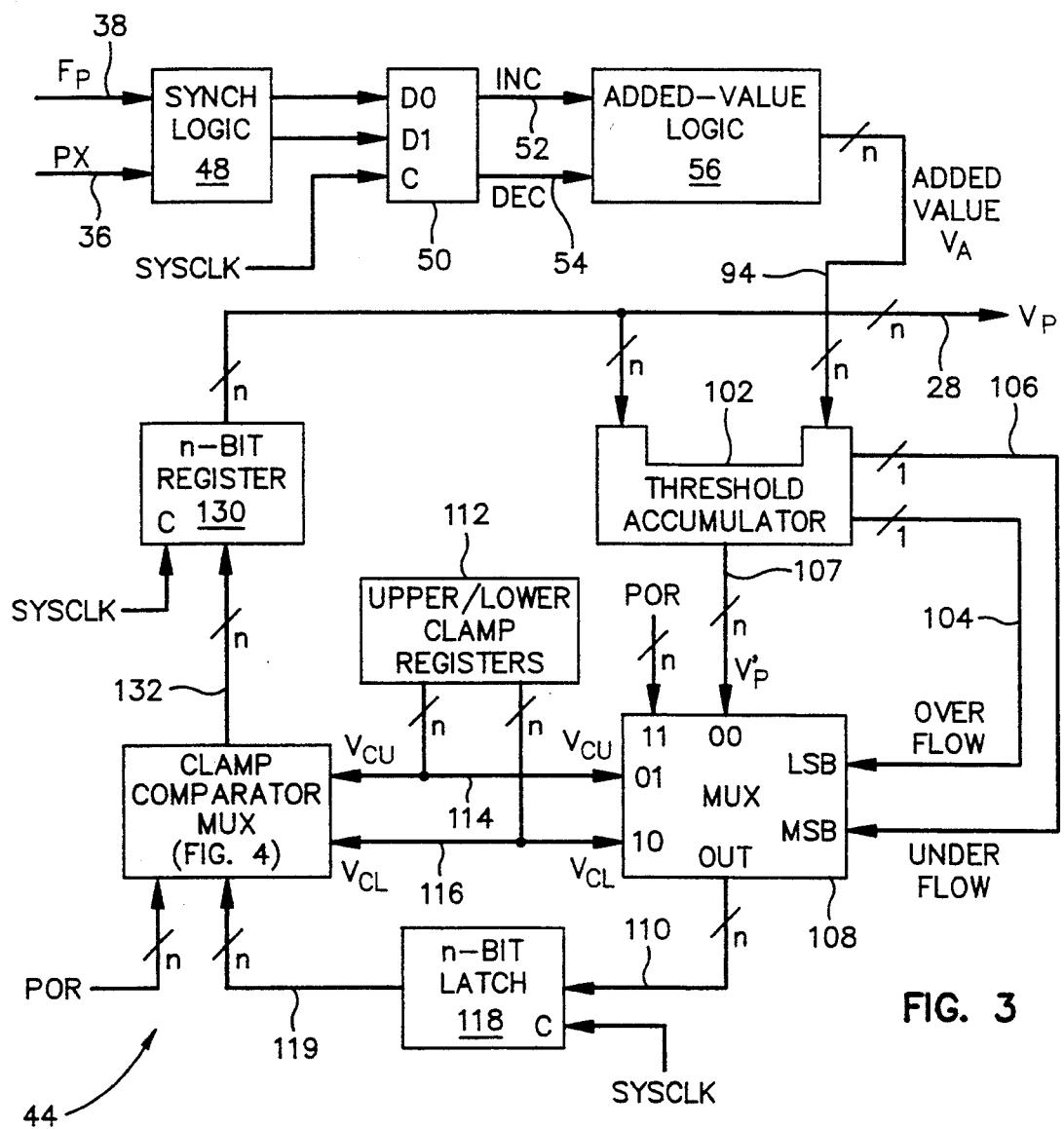
FIG. 3 shows a functional block diagram of the preferred embodiment of the threshold logic circuit of this invention.

FIG. 3 provides a detailed functional illustration of threshold logic circuit 44. Other than a power-on reset (POR) and the system clock (SYSCLK), the two comparator output signals $F_P$ and PX on lines 38 and 36 are the only inputs to logic circuit 44. These two pulse signals are synchronized in a synchronization logic 48, which is preferably the usual pulse-catching circuit. A two-bit register 50 then creates a four-state threshold error flag signal. The (00) state represents the condition where no peak exists in the signal ($F_P=0$). The (11) state represents an error condition where the peak-threshold level $T_P$ is both too high and too low. The two remaining states (10) and (01) each represent threshold level errors requiring, respectively, an "increment" or a "decrement" to the existing threshold level $T_P$.

The contents of register 50 are produced at output lines 52 and 54 for processing by the added-value logic 56. If a peak is found ($F_P=1$) and the peak threshold is never crossed ($PX \neq 1$), then the threshold level $T_P$ is presumed to be too high and register 50 adopts a (01) state, raising line 54 to one and holding line 52 to zero. This is the "decrement" state of register 50. If PX=1, then it is presumed that the peak threshold level is too low, and register 50 adopts a (10) state. This is the "increment" state of register 50, where line 52 rises to one and line 54 drops to zero. Thus, for each time that $F_P$ falls from one to zero, indicating the presence of a new peak in signal $S_P$, register 50 generates a new increment or decrement signal, but not both.

Figure 5:
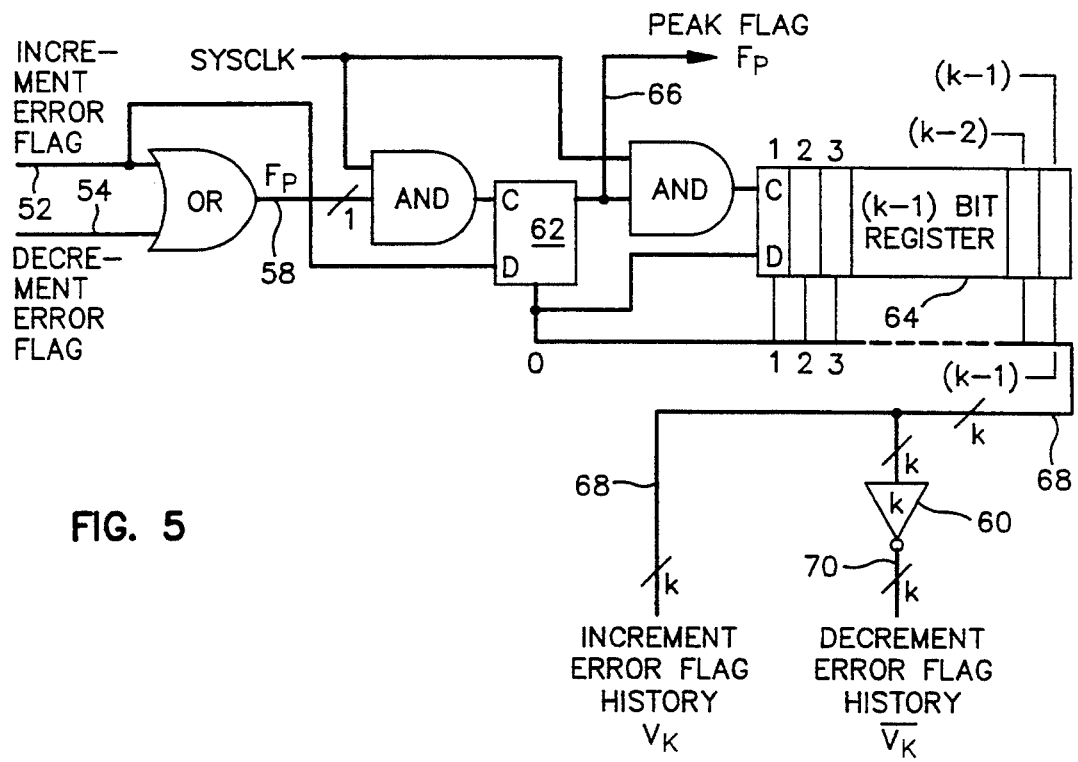
FIG. 5 shows a functional block diagram of the preferred embodiment of the error flag history register of this invention.

FIG. 5 illustrates the input register stage of added-value logic 56. The increment and decrement lines 52 and 54 are ORed to create an event clocking signal $F_P$ at line 58, which is created by the peak detection flag $F_P$. Because the increment and decrement signals always have opposite values, only the increment signal at line 52 is processed in FIG. 5. The decrement signal history $\overline{V}_k$ can be recovered simply by inverting the increment signal history $V_K$ with the k-bit inverter 60 shown in FIG. 5.

Each new peak detection flag $F_P$ creates a new increment or decrement signal. This new signal is first clocked into a one-bit register 62. At each new peak detection $F_P$, the increment signal value (either one or zero) is clocked along the $(k-1)$-bit register 64 by the peak detection flag $F_P$ on the register clock line 66. Thus, registers 62 and 64 make up a memory element holding the last (k) states of the increments error flag. The inventors have implemented the apparatus of this invention for k=14 bits.

The k-bit history is simply the k-bit digital value $V_K$, which is transferred out of registers 62 and 64 on the k-bit bus 68. Error flag history sequence $V_K$ is the increment error flag history on bus 68. This increment error flag history is inverted by k-bit parallel inverter 60 to create the decrement error flag history $\overline{V}_K$ on bus 70. Both increment and decrement error flag histories are then independently processed to select a digital magnitude for correcting the peak threshold level $T_P$ by two essentially identical embodiments of the circuitry illustrated in FIG. 6.

Figure 6:
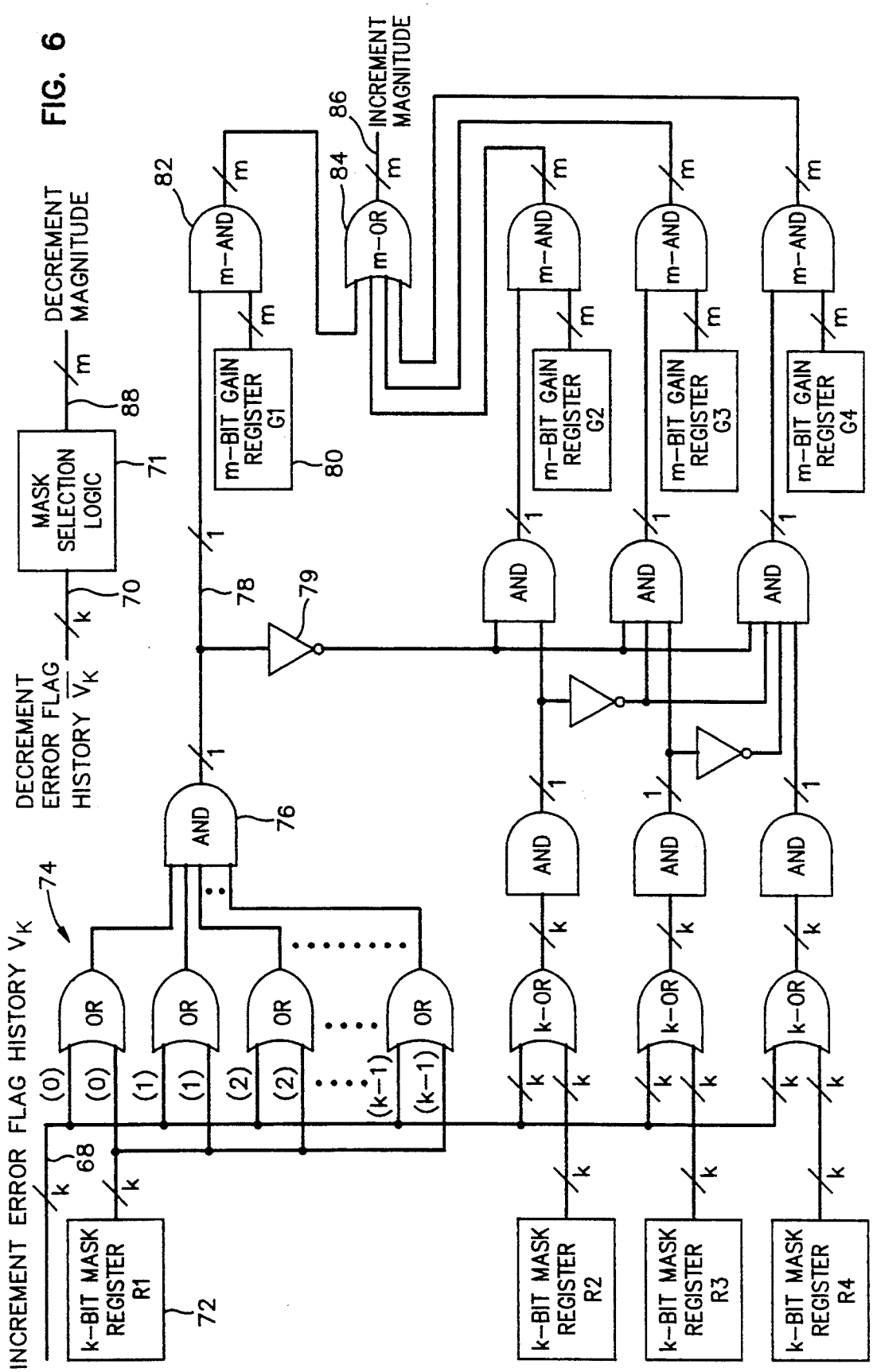
FIG. 6 shows a functional block diagram of the preferred embodiment of the added value selection logic of this invention.

FIG. 6 shows the mask-selection logic circuit for deriving an m-bit error-correction magnitude from the error flag history sequences on buses 68 or 60. Added-value logic 56 contains two identical mask-selection logic circuits exemplified by circuit 71. A plurality of k-bit mask registers, exemplified by mask register 72, is provided. The k-bit outputs from register 72 are ORed with the error flag history sequence $V_K$ on k-bit bus 68 using a k-bit OR logic circuit, exemplified by k-OR circuit 74. The k-bit outputs from k-OR circuit 74 are then ANDed by the AND circuit 76 to create a single mask selection signal on line 78. This selection signal 78 is inverted at the inverter 79 and routed to disable all lower-priority mask selection AND-gates. Thus, the mask selection signal ensures that the first (highest priority) mask to match the history sequence $V_K$ grabs control of the output.

The mask selection signal 78 is unity only when the "unmasked portion" of error flag history sequence $V_K$ contains all "1" bits. If mask register 72 is loaded with (k) "1" bits, selection signal 78 is always high (one) because all bits in $V_K$ on bus 68 are "masked". If mask register 72 includes a region of "0" bits representing an "unmasked" region, the corresponding region in $V_K$ on bus 68 must contain only "1" bits if mask selection signal 78 is to be high. The error flag history sequence $V_K$ is tested simultaneously against a plurality of different bit-masks contained in the plurality of mask registers exemplified by mask register 72. For instance, if $V_K = 1100000000000$, then the last two signal peaks rose above the threshold $T_P$ and the preceding twelve peaks fell short of $T_P$. If the bit mask in mask registers 72 covers all but the two most recent bit positions, then that mask is selected because mask selection signal 78 rises to unity. Each bit mask is created to represent a different rate-of-change in peak-threshold error conditions and the "priority" arrangement avoids multiple mask selection.

When mask selection signal 78 rises to unity, the corresponding predetermined m-bit "gain" value is selected to adjust the peak threshold level $T_P$. A plurality of such predetermined "gain" values are stored in a plurality of m-bit gain registers exemplified by gain register 80. When mask selection signal 78 rises, the m-bit output from gain register 80 is transferred through the m-AND-gate 82. The m-OR-gate 84 connects the m-bit outputs from the several m-AND-gates exemplified by m-AND-gate 82. The m-bit output from m-OR-gate 84 on bus 86 is used as the (m) least significant bits (LSBs) of the predetermined added value $V_A$ selected for peak threshold level correction.

Figure 7:
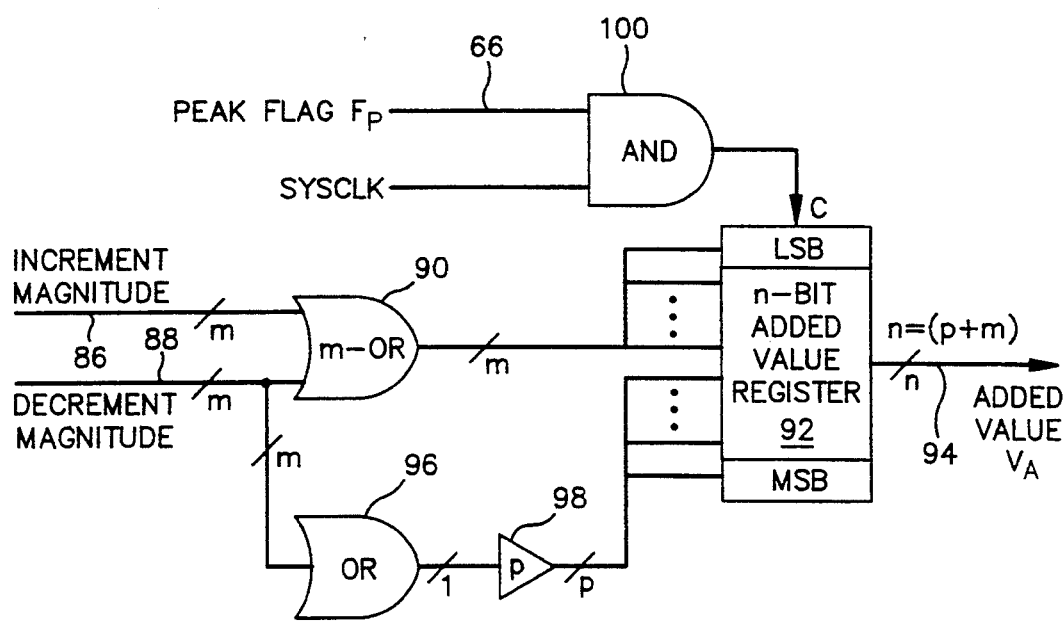
FIG. 7 shows a functional block diagram of the preferred embodiment of the added value output register of this invention.

FIG. 7 shows the functional block diagram of the output register stage of added-value logic 56 from FIG. 3. The increment magnitude on m-bit bus 86 and a decrement magnitude on the m-bit bus 88 from mask-selection logic circuit 71 are input to the m-OR-gate 90 to create the (m) LSBs of the predetermined added value $V_A$ stored in m-bit added value register 92. The contents of register 92 are produced on the n-bit bus 94. The remaining (p) bits of the n-bit added value $V_A$ are determined from the inverted error flag history sequence $\overline{V}_K$ on m-bit bus 88 by ORing the m-bits together in an OR-gate 96 and replicating the 1-bit result with a p-bit buffer 98. Thus, if any of the m-bits on bus 88 are unity, buffer 98 provides (p) "1" bits to register 92, representing the filling out of a twos-compliment representation of a "decrement" added value $V_A$. Otherwise, the upper p-bits in register 92 are "0" bits rounding out an "increment" added value $V_A$. The contents of register 92 are clocked by the peak detection flag $F_P$ ANDed with the system clock in an AND-gate 100. The inventors have implemented the apparatus of this invention with n=7, p=3 and m=4.

Referring to FIG. 3, the added value $V_A$ on n-bit bus 94 is added to the current digital threshold value $V_P$ on bus 28 in a threshold accumulator 102 to create an updated threshold value $V_P' = V_A + V_P$. Accumulator 102 is a Carry Look Ahead-Carry Select (CLA-CS) adder. The least significant m-bit adder (not shown) is a CLA adder. If accumulator 102 overflows, a "1" bit signal is produced on overflow line 104. Similarly, if accumulator 102 underflows, a "1" bit signal is produced on underflow line 106. Overflow and underflow signals 104 and 106 are presented to a multiplexer (MUX) 108. MUX 108 has the four n-bit inputs labelled in FIG. 3 as (00), (01), (10) and (11). These two bit positions are ordered with the underflow signal 106 as most significant and the overflow signal 104 as least significant. Thus, if both lines 104 and 106 are low, MUX 108 selects the updated digital threshold value $V_P'$ on the n-bit bus 107 and connects it to the n-bit output bus 110. If both overflow and underflow conditions are high, output bus 110 is reset to zero by connection to a POR reset signal, responsive to the obvious error condition. Upon an overflow condition, an n-bit upper clamp value $V_{CU}$ is selected and, upon underflow, an n-bit lower clamp value $V_{CL}$ is selected for output on n-bit bus 110. The clamp registers 112 provide the upper clamp value $V_{CU}$ on the n-bit bus 114 and the lower clamp value $V_{CL}$ on the n-bit bus 116.

Figure 4:
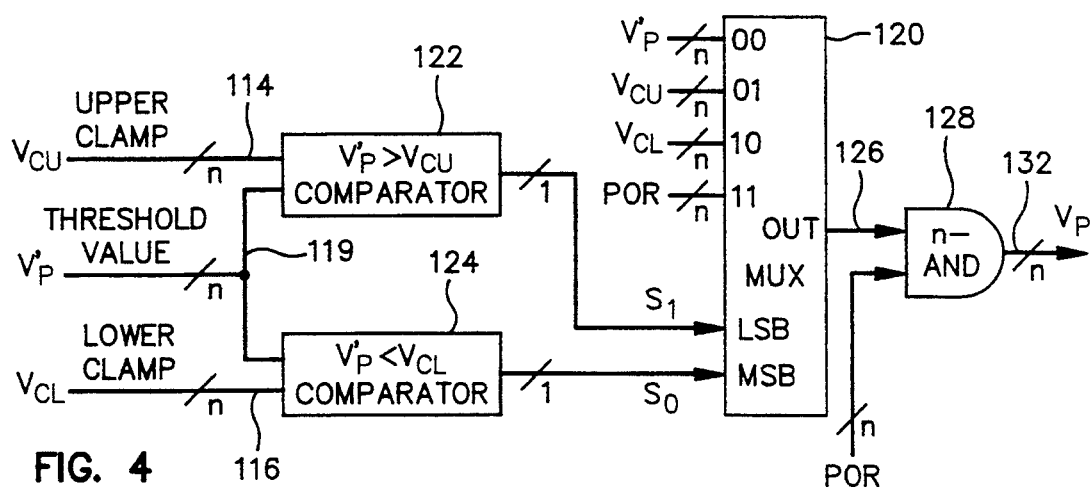
FIG. 4 shows a functional block diagram of the preferred embodiment of the clamp comparator multiplexer of this invention.

The n-bit value on MUX output bus 110 is latched in an n-bit latch 118 responsive to the system clock. Latch 118 output is then tested by a clamp comparator MUX 120 illustrated in FIG. 4. Updated digital threshold value $V_P'$ on n-bit bus 119 is compared with the upper and lower clamps on n-bit buses 114 and 116 using comparators 122 and 124 respectively. The two 1-bit outputs from comparators 122 and 124 are respectively presented to MUX 120 as the least and most significant bits of a 2-bit word. The n-bit output bus 126 carries the clamped digital threshold output value selected in a manner similar to the above discussion in connection with MUX 108. The functions of MUX 108 and MUX 120 can be combined but are separated herein by the inventors for pipeline timing purposes.

The n-bits on bus 126 are ANDed with the Power-On Reset (POR) signal by the n-AND-gate 128 so the n-bit output is reset during power-up. The n-bit bus 132 from gate 128 connects the n-bit digital threshold value $V_P'$ output to register 130, where it is latched by the system clock, replacing the old digital threshold value $V_P$ with the new value $V_P'$, which now becomes $V_P$. Bus 28 from register 130 provides the new digital threshold value $V_P$ to current generator 20 (FIG. 1) for creation of a new analog threshold level $T_P$, thereby completing the error correction loop for the peak-threshold tracking circuit. The error correction response time is about four system clock cycles, although only one error correction occurs between any two signal peaks.

Figure 8:
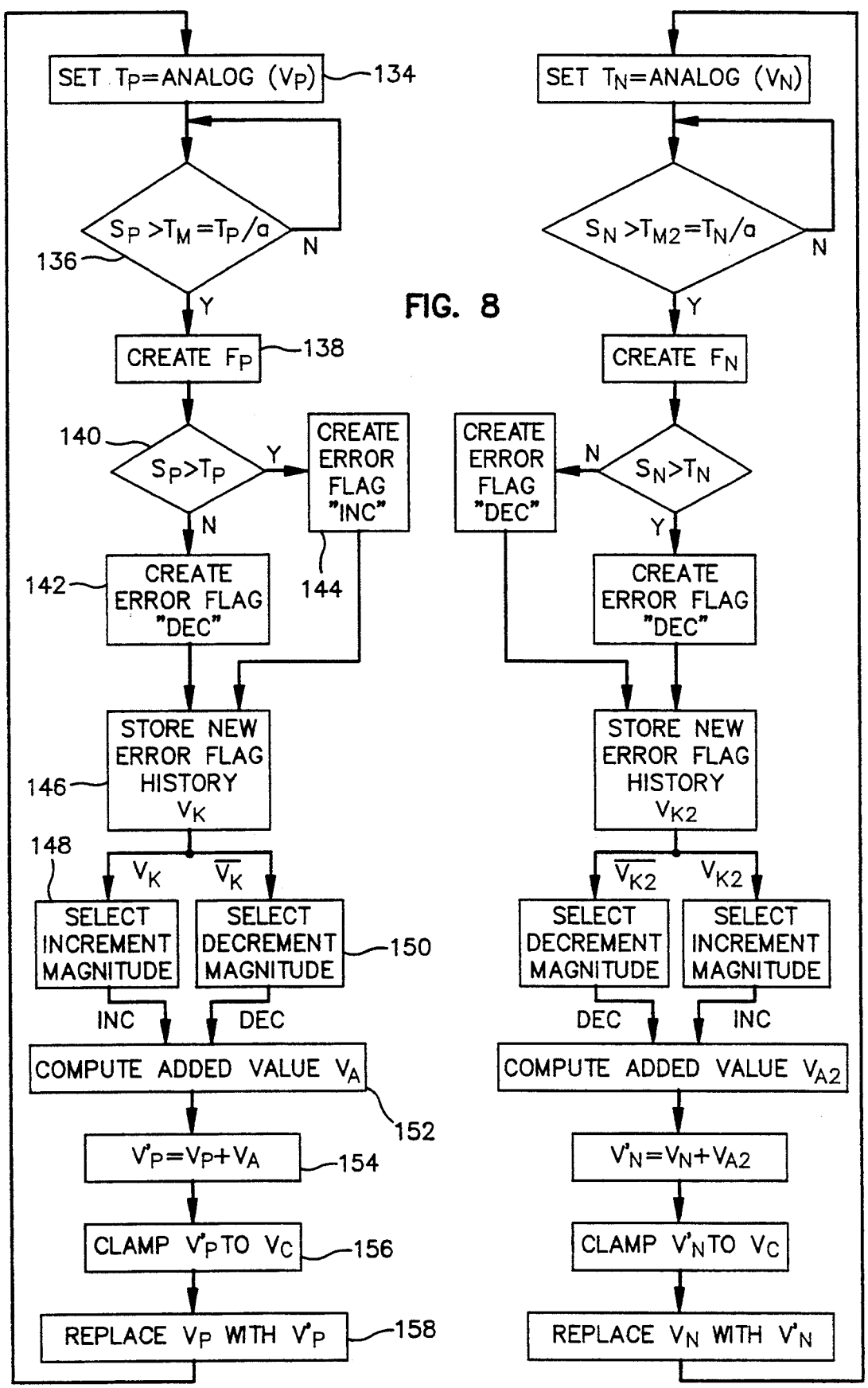
FIG. 8 shows a flow diagram illustrating the method of this invention.

FIG. 8 provides a simple flow diagram of the threshold tracking method of this invention. FIG. 8 includes two independent peak-threshold level adjustment loops; one for the positive threshold level $T_P$ and one for the negative peak-threshold level $T_N$. Except for the polarity of the peak-threshold test of the analog signal S, both peak-threshold adjustment loops operate in substantially the same way and may be understood with reference to the following discussion of the $T_P$ adjustment loop.

In a preliminary step 134, the analog threshold level $T_P$ is generated according to the digital peak-threshold value $V_P$. Any suitable digital-to-analog conversion process may be used to generate the level $T_P$. The incoming analog signal $S_P$ is then tested against an intermediate threshold level $T_M = T_P/a$ in a comparison step 136. The value of scalar (a) may be adjusted and is most useful when set within the interval [1.3, 4.0] so that $T_M$ ranges between 25% and 75% of $T_P$. Comparison step 136 is continuously performed by analog circuitry so that a peak detection flag $F_P$ is created in a step 138 as soon as signal $S_P$ exceeds intermediate threshold $T_M$. Peak detection flag $F_P$ is the asynchronous timing signal that drives the subsequent steps of the peak-threshold adjustment procedure of this invention.

For each new peak detection flag $F_P$ transition from "0" to "1", the following steps are taken. Analog signal $S_P$ is tested against analog peak-detection threshold level $T_P$ in a continuous comparison step 140. If $S_P$ exceeds $T_P$ at any point during the "high" state of peak detection flag $F_P$, an "increment" error flag $F_E$ is created in a step 144. Otherwise, a "decrement" error flag $F_E$ is created in a step 142. The logic here is uncomplicated. If the peak detection flag $F_P$ indicates that $S_P$ has peaked, then the success or failure of comparison step 140 provides instantaneous information about the peak-threshold level error. The peak-threshold level is either too low or too high and the "increment" or "decrement" states of the error flag $F_E$ reflect the change required to correct threshold level error. A new error flag is created for each new signal peak and the most recent plurality (k) of these flags is stored sequentially in a storage step 146. The new error flag $F_E$ created in either step 142 or 144 is stored as the Most Recent Bit in a register in step 146, pushing the existing Least Recent Bit from the register to be lost. The k-bit word stored in the error flag history register is herein denominated the error flag history value $V_K$.

Error flag history value $V_K$ is next tested for the presence of several predetermined characteristics. The inverted history $\overline{V}_K$ is also similarly (but not necessarily identically) tested in a decrement magnitude selection step 150. Magnitude selection steps 148 and 150 simply select one of several predetermined error correction values $\{V\}$ depending on the clustering of "1" bits in $V_K$ and $\overline{V}_K$. That is, by evaluating the nature of any clustering of increment and decrement error flags over the recent history of signal $S_P$, steps 148 and 150 can respond to changes in peak-threshold level errors by increasing or decreasing the magnitude of each peak-threshold level adjustment.

The results of selection steps 148 and 150 are then combined by step 152 to compute the digital added value $V_A$ required for proper correction of the instantaneous error that appears to exist in the digital peak-threshold value $V_P$. Added value $V_A$ is an n-bit binary number, where n=k/2 is a useful value. The adjusted digital-threshold value $V_{P'} = V_P + V_A$ is next computed in step 154. The adjusted threshold value $V_{P'}$ is clamped to a predetermined clamp value $V_C$ in step 156 to restrict the range of threshold value $V_P$. Finally, in step 158, the digital peak-threshold level value $V_P$ is updated by replacing it with the adjusted digital peak-threshold value $V_{P'}$, thereby closing the loop and returning control to step 134.

The advantages of the method shown in FIG. 8 include the elimination of threshold ripple. Because the analog threshold level $T_P$ is controlled by a stored digital value $V_P$, there is no threshold droop between signal peaks. This improves the effective signal-to-noise ratio of the peak detection process. Moreover, the selection steps 148 and 150 can be adjusted under software control for variety of purposes. Also, the intermediate threshold variable (a) can be adjusted. This control flexibility allows the method of FIG. 8 to be adapted to a variety of different read channel equalization schemes. Finally, except for the analog comparison operations, the entire procedure can be implemented in low-power digital form, thereby increasing reliability and reducing cost.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. In a peak detector for detecting extrema in an analog signal $S_P$, a method for adjusting the level of an analog peak threshold signal $T_P$ to compensate for extrema level fluctuation in said analog signal $S_P$, said analog threshold signal $T_P$ corresponding to a digital threshold value $V_P$, said method comprising the steps of:

comparing said analog signal $S_P$ to an analog intermediate threshold signal $T_M = T_P/a$ and to said analog peak threshold signal $T_P$, wherein (a) is a positive scaler greater than unity;

creating a peak flag $F_P$ having a one state ($F_P = 1$) corresponding to a level of said analog signal $S_P > T_M$ and having a zero state ($F_P = 0$) otherwise;

creating an error flag Fu responsive to transition of said peak flag $F_P$ from said zero state to said one state, said error flag $F_E$ having an increment state ($F_E = 1$) corresponding to a level of said analog signal $S_P > T_P$ and having a decrement state ($F_E = 0$) otherwise;

storing said error flag $F_E$ as the latest in a sequence $V_K$ of a plurality of said error flags;

adding a predetermined digital value $V_A$ corresponding to said error flag sequence $V_K$ to said digital threshold value $V_P$ to form an adjusted digital threshold value $V_{P'} = V_A + V_P$;

converting said adjusted digital threshold value $V_{P'}$ to analog form, thereby generating an adjusted analog peak threshold signal $T_{P'}$; and repeating the above steps for an analog peak threshold signal $T_P$ equal to said adjusted analog peak threshold signal $T_{P'}$.

2. The method of claim 1 wherein said adding step comprises the additional step of:

comparing the magnitude of said adjusted digital threshold value $|V_{P'}|$ to the magnitude of a predetermined clamp value $|V_C|$ and setting said adjusted digital threshold value magnitude $|V_{P'}|$ equal to the lesser said magnitude so that $V_{P'} = \text{sgn}(V_{P'}) * \min(|V_{P'}|, |V_C|)$.

3. The method of claim 2 wherein said adding step comprises the additional steps of:

masking said error flag sequence $V_K$ with each of a plurality of prioritized bit masks, each said bit mask having masked and unmasked bit positions and a priority;

selecting said bit mask having the highest priority for which said unmasked bit positions of said error flag sequence $V_K$ are uniformly valued; and selecting said predetermined digital value $V_A$ corresponding to said selected bit mask from among a plurality of predetermined digital values $\{V\}$.

4. The method of claim 3 wherein said analog signal $S_P$ is a differential analog signal and a second analog signal $S_N = -S_P$, said method further comprising the step of:

adjusting the level of a second analog peak threshold signal $T_N$ to compensate for extrema level fluctuation in said second analog signal $S_N$.

5. The method of claim 2 wherein said analog signal $S_P$ is a differential analog signal and a second analog signal $S_N = -S_P$, said method further comprising the step of:

adjusting the level of a second analog peak threshold signal $T_N$ to compensate for extrema level fluctuation in said second analog signal $S_N$.

6. The method of claim 1 wherein said adding step comprises the additional steps of:

masking said error flag sequence $V_K$ with each of a plurality of prioritized bit masks, each said bit mask having masked and unmasked bit positions and a priority;

selecting said bit mask having the highest priority for which said unmasked bit positions of said error flag sequence $V_K$ are uniformly valued; and selecting said predetermined digital value $V_A$ corresponding to said selected bit mask from among a plurality of predetermined digital values.

7. The method of claim 1 wherein said analog signal $S_P$ is a differential analog signal and a second analog signal $S_N = -S_P$, said method further comprising the step of:

adjusting the level of a second analog peak threshold signal $T_N$ to compensate for extrema level fluctuation in said second analog signal $S_N$.

8. In a peak detector for detecting extrema in an analog signal $S_P$, a digital peak-threshold tracking apparatus for adjusting the level of an analog peak threshold signal $T_P$ to compensate for extrema level fluctuation in said analog signal $S_P$, said analog peak threshold level $T_P$ corresponding to a digital threshold value $V_P$, said apparatus comprising:

signal input means for accepting said analog signal $S_P$;

first comparator means coupled to said signal input means for comparing said analog signal $S_P$ to an analog intermediate threshold signal $T_M = T_P/a$, wherein (a) is a positive scaler greater than unity;

second comparator means coupled to said signal input means for comparing said analog signal $S_P$ to said analog threshold signal $T_P$;

peak detection logic means coupled to said first and said second comparator means for creating a peak flag $F_P$ having a one state ($F_P=1$) corresponding to a level of said analog signal $S_P > T_M$ and having a zero state ($F_P=0$) otherwise;

error flag logic means coupled to said peak detection logic means for creating an error flag $F_E$ responsive to a transition of said peak flag $F_P$ from said zero state so said one state, said error flag $F_E$ having an increment state ($F_E=1$) corresponding to a level of said analog signal $S_P > T_P$ and having a decrement state ($F_E=0$) otherwise;

error flag history means coupled to said error flag logic means for storing said error flag $F_E$ as the latest in a sequence $V_K$ of a plurality of said error flags;

added value logic means coupled to said error flag history means for selecting a predetermined digital value $V_A$ corresponding to said error flag sequence $V_K$;

accumulator means coupled to said added value logic means for adding said predetermined digital value $V_A$ to said digital threshold value $V_P$ to form an adjusted digital threshold value $V_P' = V_A + V_P$; and digital-to-analog converter means coupled to said accumulator means for converting said adjusted digital threshold value $V_P'$ to analog form, thereby generating an adjusted analog peak threshold signal $T_P'$.

9. The digital peak threshold tracking apparatus of claim 8 wherein said accumulator means comprises:

clamping means for limiting the magnitude of said digital value $|V_P'|$ to the magnitude of a predetermined clamp value $|V_C|$.

10. The digital peak threshold tracking apparatus of claim 9 wherein said added value logic means comprises:

a plurality of prioritized bit mask register means for storing predetermined bit masks each having masked and unmasked bit positions and a priority;

error flag history comparator means coupled to said prioritized bit mask register means for masking said error flag sequence $V_K$ according to one or more said predetermined bit masks;

priority encoder means coupled to said error flag history comparator means for selecting one said predetermined bit mask for which said unmasked bit positions of said error flag sequence $V_K$ are uniformly valued; and a plurality of register means coupled to said priority encoder means for storing a plurality of predetermined digital values $\{V\}$, one of which corresponds to said predetermined digital value $V_A$ corresponding to said bit mask selected by said one predetermined priority encoder means.

11. The digital peak threshold tracking apparatus of claim 10 wherein said analog signal $S_P$ is in a differential analog signal and a second analog signal $S_N = -S_P$, wherein the level of a second analog peak threshold signal $T_N$ is adjusted to compensate for extrema level fluctuation in said second analog signal $S_N$, said apparatus further comprising:

second signal input means for accepting said second analog signal $S_N$;

third comparator means coupled to said second signal input means for comparing said analog signal $S_N$ to a second intermediate analog threshold signal $T_{M2} = T_N/a$, wherein (a) is a positive scaler greater than unity;

fourth comparator means coupled to said second signal input means for comparing said analog signal $S_N$ to said second analog peak threshold signal $T_N$;

second peak detection logic means coupled to said third and said fourth comparator means for creating a second peak flag $F_N$ having a one state ($F_N=1$) corresponding to a level of said analog signal $S_N > T_{M2}$ and having a zero state ($F_N=0$) otherwise;

second error flag logic means coupled to said second peak detection logic means for creating a second error flag $F_{E2}$ responsive to a transition of said second peak flag $F_N$ from said zero state to said one state, said second error flag $F_{E2}$ having an increment state ($F_{E2}=1$) corresponding to a level of said analog signal $S_N > T_N$ and having a decrement state ($F_{E2}=0$) otherwise;

second error flag history means coupled to said second error flag logic means for storing said second error flag $F_{E2}$ as the latest in a second sequence $V_{K2}$ of a plurality of said second error flags;

second added value logic means coupled to said second error flag history means for selecting a second predetermined digital value $V_{A2}$ corresponding to said second error flag sequence $V_{K2}$;

second accumulator means coupled to said second added value logic means for adding said second predetermined digital value $V_{A2}$ to a second digital threshold value $V_N$ to form an adjusted second digital threshold value $V_N' = V_{A2} + V_N$; and second digital-to-analog converter means coupled to said second accumulator means for converting said adjusted second digital threshold value $V_N'$ to analog form, thereby generating an adjusted second analog peak threshold signal $T_N'$.

12. The digital peak threshold tracking apparatus of claim 9 wherein said analog signal $S_P$ is in a differential analog signal and a second analog signal $S_N = -S_P$, wherein the level of a second analog peak threshold signal $T_N$ is adjusted to compensate for extrema level fluctuation in said second analog signal $S_N$, said apparatus further comprising:

second signal input means for accepting said second analog signal $S_N$;

third comparator means coupled to said second signal input means for comparing said analog signal $S_N$ to a second intermediate analog threshold signal $T_{M2} = T_N/a$, wherein (a) is a positive scaler greater than unity;

fourth comparator means coupled to said second signal input means for comparing said analog signal $S_N$ to said second analog peak threshold signal $T_N$;

second peak detection logic means coupled to said third and said fourth comparator means for creating a second peak flag $F_N$ having a one state ($F_N = 1$) corresponding to a level of said analog signal $S_N < T_{M2}$ and having a zero state ($F_N = 0$) otherwise;

second error flag logic means coupled to said second peak detection logic means for creating a second error flag $F_{E2}$ responsive to a transition of said second peak flag $F_N$ from said zero state to said one state, said second error flag $F_{E2}$ having an increment state ($F_{E2} = 1$) corresponding to a level of said analog signal $S_N > T_N$ and having a decrement state ($F_{E2} = 0$) otherwise;

second error flag history means coupled to said second error flag logic means for storing said second error flag $F_{E2}$ as the latest in a second sequence $V_{K2}$ of a plurality of said second error flags;

second added value logic means coupled to said second error flag history means for selecting a second predetermined digital value $V_{A2}$ corresponding to said second error flag sequence $V_{K2}$;

second accumulator means coupled to said second added value logic means for adding said second predetermined digital value $V_{A2}$ to a second digital threshold value $V_N$ to form an adjusted second digital threshold value $V_N' = V_{A2} + V_N$; and second digital-to-analog converter means coupled to said second accumulator means for converting said adjusted second digital threshold value $V_N'$ to analog form, thereby generating an adjusted second analog peak threshold signal $T_N'$.

13. The digital peak threshold tracking apparatus of claim 8 wherein said added value logic means comprises:

a plurality of prioritized bit mask register means for storing predetermined bit masks each having masked and unmasked bit positions and a priority;

error flag history comparator means coupled to said prioritized bit mask register means for masking said second error flag sequence $V_{K2}$ according to one or more said predetermined bit masks;

priority encoder means coupled to said error flag history comparator means for selecting one said predetermined bit mask for which said unmasked bit positions of said second error flag sequence $V_{K2}$ are uniformly valued; and a plurality of register means coupled to said priority encoder means for storing a plurality of predetermined digital values, one of which is said second predetermined digital value $V_{A2}$ corresponding to said bit mask selected by said one predetermined priority encoder means.

14. The digital peak threshold tracking apparatus of claim 8 wherein said analog signal $S_P$ is in a differential analog signal and a second analog signal $S_N = -S_P$, wherein the level of a second analog peak threshold signal $T_N$ is adjusted to compensate for extrema level fluctuation in said second analog signal $S_N$, said apparatus further comprising:

second signal input means for accepting said second analog signal $S_N$;

third comparator means coupled to said second signal input means for comparing said analog signal $S_N$ to a second intermediate analog threshold signal $T_{M2} = T_N/a$, wherein (a) is a positive scaler greater than unity;

fourth comparator means coupled to said second signal input means for comparing said analog signal $S_N$ to said second analog peak threshold signal $T_N$;

second peak detection logic means coupled to said third and said fourth comparator means for creating a second peak flag $F_N$ having a one state ($F_N = 1$) corresponding to a level of said analog signal $S_N < T_{M2}$ and having a zero state ($F_N = 0$) otherwise;

second error flag logic means coupled to said second peak detection logic means for creating a second error flag $F_{E2}$ responsive to a transition of said second peak flag $F_N$ from said zero state to said one state, said second error flag $F_{E2}$ having an increment state ($F_{E2} = 1$) corresponding to a level of said analog signal $S_N > T_N$ and having a decrement state ($F_{E2} = 0$) otherwise;

second error flag history means coupled to said second error flag logic means for storing said second error flag $F_{E2}$ as the latest in a second sequence $V_{K2}$ of a plurality of said second error flags;

second added value logic means coupled to said second error flag history means for selecting a second predetermined digital value $V_{A2}$ corresponding to said second error flag sequence $V_{K2}$;

second accumulator means coupled to said second added value logic means for adding said second predetermined digital value $V_{A2}$ to a second digital threshold value $V_N$ to form an adjusted second digital threshold value $V_N' = V_{A2} + V_N$; and second digital-to-analog converter means coupled to said second accumulator means for converting said adjusted second digital threshold value $V_N'$ to analog form, thereby generating an adjusted second analog peak threshold signal $T_N'$.

* * * * *

UNITED STATES PATENT AND TRADEMARK OFFICE
CERTIFICATE OF CORRECTION

PATENT NO. : 5,363,100
DATED : November 8, 1994
INVENTOR(S) : Bailey et al

It is certified that error appears in the above-indentified patent and that said Letters Patent is hereby corrected as shown below:

Col. 8, line 15, please replace "Fu" with --$F_E$--.

Col. 10, lines 20-21, please insert --one predetermined-- following the first occurrance of "said" and delete "one predetermined" following the second occurrance of "said".

Col. 12, line 10, please insert --one predetermined-- following the first occurrance of "said" and delete "one predetermined" following the second occurrance of "said".

Signed and Sealed this

Fourteenth Day of February, 1995

Attest:

BRUCE LEHMAN

Attesting Officer          Commissioner of Patents and Trademarks